(12) United States Patent  (10) Patent No.: US 8,411,481 B2
Lim  (45) Date of Patent: Apr. 2, 2013

(54) INFORMATION STORAGE DEVICES USING MAGNETIC DOMAIN WALL MOVEMENT AND METHODS OF MANUFACTURING THE SAME

(75) Inventor: Chee-kheng Lim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/200,358

(22) Filed: Sep. 23, 2011

(65) Prior Publication Data

US 2012/0015452 A1  Jan. 19, 2012

Related U.S. Application Data

(62) Division of application No. 11/980,553, filed on Oct. 31, 2007, now Pat. No. 8,054,666.

(30) Foreign Application Priority Data

Dec. 22, 2006 (KR) .................. 10-2006-0133095
Dec. 29, 2006 (KR) .................. 10-2006-0138862
Dec. 29, 2006 (KR) .................. 10-2006-0138866

(51) Int. Cl.
 *G11C 19/00* (2006.01)
(52) U.S. Cl. .......... 365/81; 365/148; 365/158; 365/171; 365/173; 365/222.5; 977/933; 977/935
(58) Field of Classification Search .................. 365/48, 365/55, 62, 66, 74, 78, 80–93, 100, 130, 365/131, 148, 158, 171–173, 225.5, 243.5; 216/22; 257/421, E21.665; 438/3; 977/933–935; 428/810–816, 817–825.1, 826
See application file for complete search history.

(56) References Cited

U.S. PATENT DOCUMENTS

| | | | |
|---|---|---|---|
| 4,550,983 A | 11/1985 | Ross | |
| 5,815,342 A | 9/1998 | Akiyama et al. | |
| 5,870,328 A | 2/1999 | Mohri | |
| 6,482,742 B1 * | 11/2002 | Chou | 438/690 |
| 6,566,872 B1 | 5/2003 | Sugitani | |
| 6,713,195 B2 * | 3/2004 | Wang et al. | 428/811.2 |
| 6,834,005 B1 * | 12/2004 | Parkin | 365/80 |

(Continued)

FOREIGN PATENT DOCUMENTS

| | | |
|---|---|---|
| GB | 1 497 653 | 1/1978 |
| JP | 5-267726 | * 10/1993 |

(Continued)

OTHER PUBLICATIONS

A.W. Holletner et al., Pinning a Domain Wall in (Ga,Mn) As with Focused Ion Beam Lithographpy, Appl. Phys. Lett 85, 5622 (2004), pp. 1-13.*

(Continued)

Primary Examiner — Harry W Byrne
(74) Attorney, Agent, or Firm — Harness, Dickey & Pierce, P.L.C.

(57) ABSTRACT

In an information storage device, a writing magnetic layer is formed on a substrate and has a magnetic domain wall. A connecting magnetic layer is formed on the writing magnetic layer, and an information storing magnetic layer is formed on an upper portion of side surfaces of the connecting magnetic layer. A reader reads information stored in the information storing magnetic layer.

16 Claims, 16 Drawing Sheets

U.S. PATENT DOCUMENTS

| | | | |
|---|---|---|---|
| 6,864,042 B1 * | 3/2005 | Kuo et al. | 430/320 |
| 6,898,132 B2 * | 5/2005 | Parkin | 365/189.12 |
| 6,920,062 B2 | 7/2005 | Parkin | |
| 7,031,178 B2 | 4/2006 | Parkin | |
| 7,236,386 B2 | 6/2007 | Parkin | |
| 7,586,781 B2 | 9/2009 | Saitoh et al. | |
| 2003/0161180 A1 | 8/2003 | Bloomquist et al. | |
| 2003/0170995 A1 | 9/2003 | Chou | |
| 2004/0134565 A1 | 7/2004 | Sun et al. | |
| 2004/0251232 A1 * | 12/2004 | Chen et al. | 216/22 |
| 2004/0252538 A1 * | 12/2004 | Parkin | 365/80 |
| 2004/0252539 A1 * | 12/2004 | Parkin | 365/80 |
| 2005/0041463 A1 * | 2/2005 | Drewes | 365/158 |
| 2005/0078509 A1 * | 4/2005 | Parkin | 365/158 |
| 2005/0078511 A1 * | 4/2005 | Parkin | 365/171 |
| 2005/0100830 A1 * | 5/2005 | Xu et al. | 430/322 |
| 2005/0174876 A1 | 8/2005 | Katoh | |
| 2005/0220990 A1 | 10/2005 | Aoyama et al. | |
| 2006/0024529 A1 | 2/2006 | Murakam | |
| 2006/0104110 A1 * | 5/2006 | Sun et al. | 365/173 |
| 2006/0120132 A1 * | 6/2006 | Parkin | 365/80 |
| 2006/0237808 A1 * | 10/2006 | Saito | 257/421 |
| 2007/0254188 A1 * | 11/2007 | Hayakawa et al. | 428/811.2 |
| 2008/0075978 A1 | 3/2008 | Weller et al. | |
| 2008/0130355 A1 | 6/2008 | Saitoh et al. | |

FOREIGN PATENT DOCUMENTS

| | | |
|---|---|---|
| JP | 2000-099924 | 4/2000 |
| JP | 2003-030812 | 1/2003 |
| JP | 2005-116022 | 4/2005 |
| JP | 2005-166240 | 6/2005 |
| WO | WO 2004/077451 | 9/2004 |

OTHER PUBLICATIONS

European Search Report (dated Feb. 26, 2008) for European Patent Application No. 07123052.8-1233.

Fassbender, J. et al., "Magnetic patterning by means of ion irradiation and implantation," Journal of Magnetism and Magnetic Materials, Elsevier Science Publishers, Amsterdam, NL, vol. 320, No. 3-4, Oct. 25, 2007, pp. 579-596.

Fassbender, J., et al., "Topical Review; Tailoring magnetism by light-ion irradiation; Topical Review" Journal of Physics D. Applied Physics, Institute of Physics Publishing, Bristol, GB, vol. 37, No. 16, Aug. 21, 2004, pp. R179-R196.

Owen, N. et al., "Patterning Magnetic Antidot-Type Arrays by Ga+Implantation,", IEEE Transactions on Magnetics, IEEE Service Center, New York, NY, vol. 38, No. 5, Sep. 2002, pp. 2553-2555.

Terris, B., et al., "Topical Review; Nanofabricated and self-assembled magnetic structures as data storage media; Topical Review" Journal of Physics D. Applied Physics, Institute of Physics Publishing, Bristol, GB, vol. 38, No. 12, Jun. 21, 2005, pp. R199-R222.

Chinese Office Action dated Nov. 27, 2009 and English translation thereof.

Chinese Office Action dated Sep. 8, 2010 and English translation thereof.

Office Action dated Jan. 19, 2011 in U.S. Appl. No. 11/980,425.

Notice of Allowance dated Jan. 25, 2011 in U.S. Appl. No. 11/980,455.

Notice of Allowance dated Jan. 25, 2011 in U.S. Appl. No. 11/980,353.

U.S. Office Action for U.S. Appl. No. 11/980,353 dated Apr. 14, 2010.

Notice of Allowance for U.S. Appl. No. 11/980,353 dated Oct. 15, 2010.

U.S. Office Action for U.S. Appl. No. 11/980,455 dated Jun. 24, 2010.

U.S. Office Action for U.S. Appl. No. 11/980,425 dated Mar. 30, 2010.

U.S. Office Action for U.S. Appl. No. 11/980,425 dated Sep. 30, 2009.

U.S. Office Action for U.S. Appl. No. 11/980,425 dated Aug. 5, 2010.

Notice of Allowance for U.S. Appl. No. 11/980,627 dated Aug. 19, 2010.

Second Office Action by the Chinese Patent Office dated Jun. 2, 2011 for Chinese Application No. 200710159774.9 with English translation.

T. Devolder et al., "Magnetization reversal in irradiation-fabricated nanostructures." *Journal of Applied Physics*, vol. 87, No. 12: Jun. 15, 2000 (pp. 8671-8681).

L. Jay Guo, "Recent progress in nanoimprint technology and its applications." *Journal of Physics D: Applied Physics*, vol. 37: 2004 (pp. R123-R141).

R. Hyndman et al., "Modification of Co/Pt multilayers by gallium irradiation—Part 1: The effect on structural and magnetic properties." *Journal of Applied Physics*, vol. 90, No. 8: Oct. 15, 2001 (pp. 3843-3849).

A. Himeno et al., "Propagation of a magnetic domain wall in magnetic wires with asymmetric notches", Journal of Applied Physics, vol. 97: 2005, (pp. 066101-1-066101-3), Mar. 4, 2005.

D. A. Allwood et al., "Domain wall diodes in ferromagnetic planar nanowires", Applied Physics Letters, vol. 85, 2848:2004, (pp. 2848-2850), Oct. 4, 2004.

W. Scholz et al., "Micromagnetic Simulation of Domain Wall Pinning and Domain Wall Motion", Vienna University of Technology, Institute of Applied and Technical Physics, to appear in "Computational Materials Science", URL: http://magnet.atp.tuwien.ac.at/scholz/projects/papers/pub_scholz.html (pp. 1-28), Feb. 4, 2002.

* cited by examiner

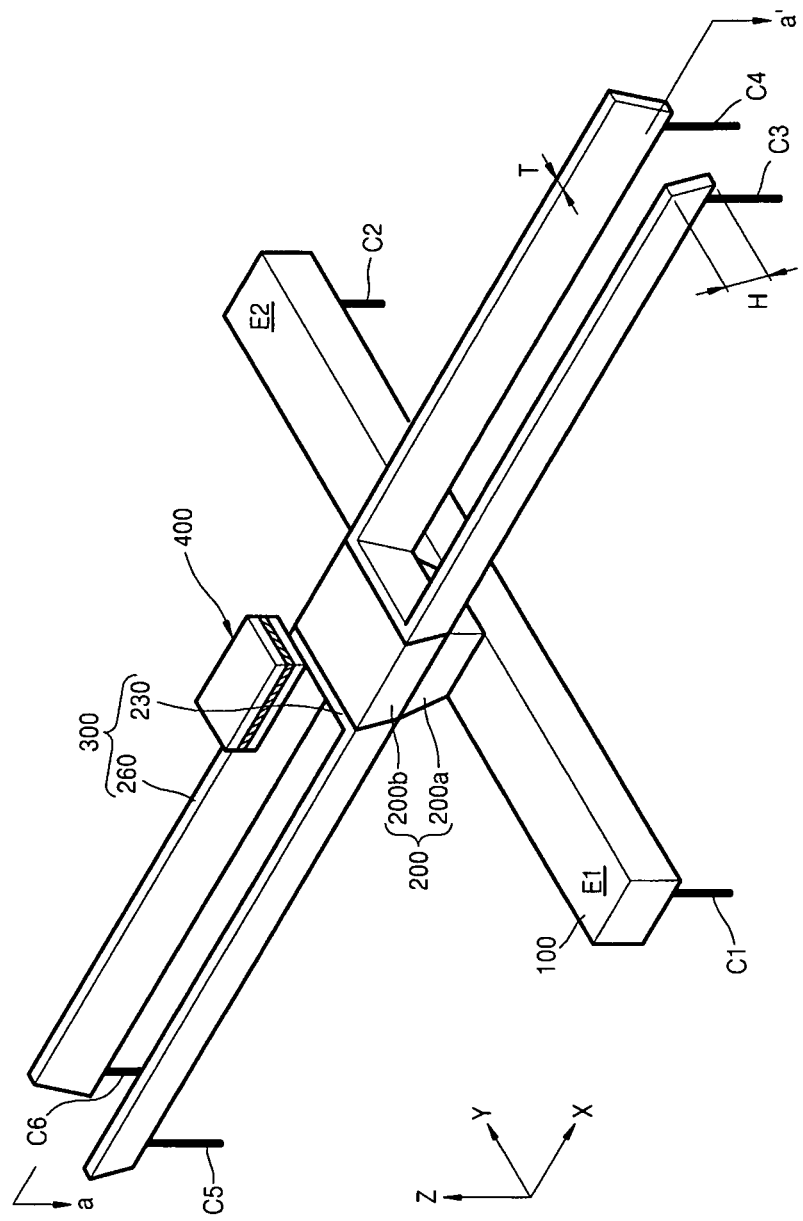

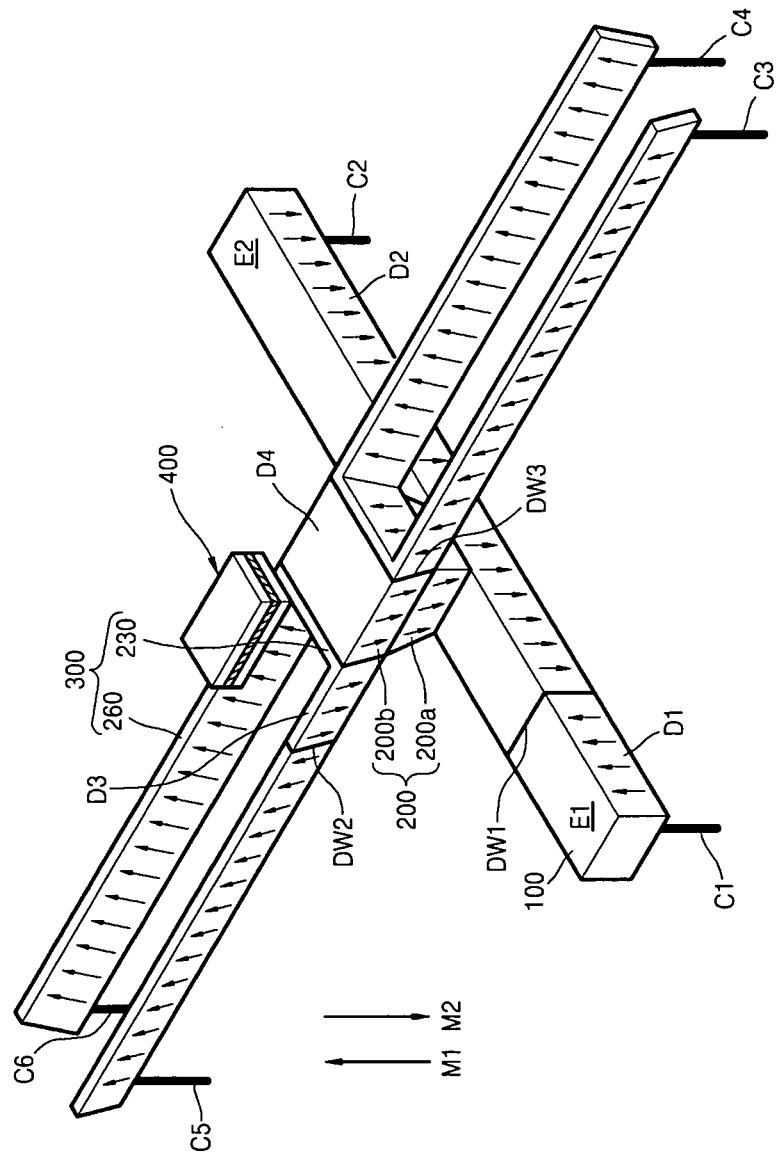

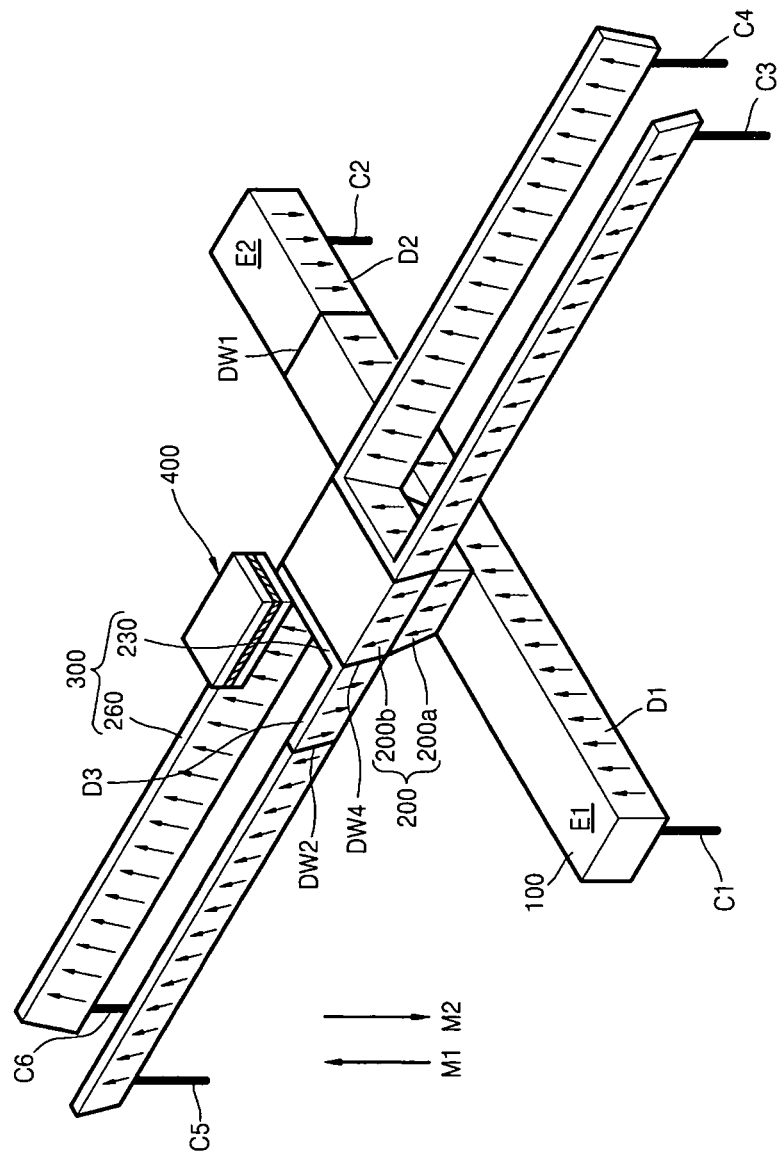

INFORMATION STORAGE DEVICES USING MAGNETIC DOMAIN WALL MOVEMENT AND METHODS OF MANUFACTURING THE SAME

PRIORITY STATEMENT

This non-provisional application is a divisional of U.S. application Ser. No. 11/980,553, filed on Oct. 31, 2007 now U.S. Pat. No. 8,054,666, which claims priority under 35 U.S.C. §119 to Korean Patent Application No. 10-2006-0138862, filed on Dec. 29, 2006, Korean Patent Application No. 10-2006-0133095, filed on Dec. 22, 2006, and Korean Patent Application No. 10-2006-0138866, filed on Dec. 29, 2006 in the Korean Intellectual Property Office, the entire contents of each of which is incorporated herein by reference.

BACKGROUND

Description of the Related Art

A conventional hard disk drive (HDD) is a device that reads and writes information by rotating a magnetic recording medium in a disk form and moving a reading/writing head above the magnetic recording medium. Conventional HDDs are non-volatile data storage devices capable of storing relatively large amounts of data on the order of 100 gigabytes (GB) of data or more. Conventional HDDs may be used as a main storage device in computers.

A conventional HDD may include a relatively large amount of moving or mechanical parts. These moving parts may be susceptible to various mechanic faults when the HDD is moved and/or subject to shock. Mechanical faults may decrease mobility and/or reliability conventional HDDs. These moving parts may also increase manufacturing complexity, costs of conventional HDDs, increase power consumption, and/or generate noise. For example, when size of conventional HDDs is reduced, manufacturing complexity and/or costs may increase.

An example of an alternative information storage device is a data storage device in which magnetic domain walls of a magnetic material are moved.

Magnetic fine regions constituting a magnetic body are referred to as magnetic domains. In these magnetic domains, the direction of the magnetoelectricity or the direction of all magnetic moments is identical. The size of the magnetic domains and the direction of the magnetization may be controlled by the property, shape, size of the magnetic material and/or external energy.

A magnetic domain wall is a boundary between magnetic domains having different magnetization directions, and may be moved by a current and/or a magnetic field applied to the magnetic material.

Magnetic domains may be passed through pinned reading/writing heads by moving the magnetic domain wall to enable reading/writing without rotation of recording medium. Information storage devices using magnetic domain wall movement may store a relatively large amount of data and may not include moving parts.

SUMMARY

Example embodiments relate to information storage devices, for example, an information storage device using magnetic domain wall movement and methods of manufacturing an information storage device.

Example embodiments provide information storage devices using magnetic domain wall movement, which may store a relatively large amount of information, provide improved mobility and/or reliability because moving parts are not required. Example embodiments also provide methods of manufacturing the data storage device.

At least one example embodiment provides an information storage device using magnetic domain wall movement. According to at least this example embodiment, a writing magnetic layer may be formed on a substrate. The magnetic wiring layer may include at least one magnetic domain wall. At least one connecting magnetic layer may be formed on the at least one writing magnetic layer. At least one information storing magnetic layer may be formed on an upper portion of a side surface of the at least one connecting magnetic layer. A reader may be configured to read information stored in the at least one information storing magnetic layer.

According to at least some example embodiments, the information storing magnetic layer may be formed on an upper portion of a first side surface of the connecting magnetic layer and an upper portion of a second side surface. The second side surface may be opposite to the first side surface. The information storing magnetic layer may include a first region and a second region. The first region may cover an upper portion of the side surface of the connecting magnetic layer. The second region may be formed on either end of the first region. The second region may be perpendicular to the first region. The second region of the information storing magnetic layer may be inclined relative to the substrate. Alternatively, the second region of the information storing magnetic layer may be perpendicular to the substrate. The height of the information storing magnetic layer may be greater than the thickness of the information storing magnetic layer.

According to at least some example embodiments, a plurality of connecting magnetic layers may be formed in a direction perpendicular to the substrate, and a plurality of information storing magnetic layers may be formed on at least two side surfaces of each of the plurality of connecting magnetic layers. A plurality of writing magnetic layers may be spaced apart on the substrate, and a plurality of connecting magnetic layers may be formed along each of the writing magnetic layers.

According to at least some example embodiments, the writing magnetic layer and the information storing magnetic layer may be perpendicular or parallel to each other. A magnetic anisotropic energy of the writing magnetic layer may be in the range of about $2 \times 10^3$ to about $10^7$ J/m$^3$, inclusive. The connecting magnetic layer may have a stack structure including a first connecting magnetic layer and a second connecting magnetic layer. A magnetic anisotropic energy of the first connecting magnetic layer may be in the range of about 10 to about $10^3$ J/m$^3$, inclusive. A magnetic anisotropic energy of the second connecting magnetic layer may be in the range of about 10 to about $10^7$ J/m$^3$, inclusive. A magnetic anisotropic energy of the information storing magnetic layer may be in the range of about $2 \times 10^3$ to about $10^7$ J/m$^3$, inclusive.

At least one other example embodiment provides a method of manufacturing an information storage device. According to at least this example embodiment, a writing magnetic layer and a first insulating layer may be formed on the substrate. The first insulating layer may cover the writing magnetic layer. An opening may be formed by patterning the first insulating layer. The opening may include a first groove and a second groove. The first and the second grooves may expose the writing magnetic layer. The first grove may be formed in the second groove and may have a width less than the second groove. A first connecting magnetic layer may be formed in the first groove, and a second connecting magnetic layer may be formed on the first connecting magnetic layer. A ring-type magnetic layer may be formed. The ring-type magnetic layer may cover a side surface of the second connecting magnetic layer and a sidewall of the second groove. An end portion of the ring-type magnetic layer may be removed.

According to at least some example embodiments, the opening may be formed using a nano-imprint process with a master stamp having a multi-step structure. The sidewall of the second groove may be inclined or perpendicular relative to the substrate.

According to at least some example embodiments, in forming the ring-type magnetic layer, a first magnetic layer may be formed on an upper surface of the first insulating layer, an upper surface and a side surface of the second connecting magnetic layer, and a bottom surface and a sidewall of the second groove. A protective layer may be formed to cover a portion of the first magnetic layer which is on the side surface of the second connecting magnetic layer and the sidewall of the second groove. Portions of the first magnetic layer formed on the bottom surface of the second groove, the upper surface of the second connecting magnetic layer and the upper surface of the first insulating layer may be removed by etching the first magnetic layer using the protective layer as an etching mask.

According to at least some example embodiments, in forming the protective layer, a second insulating layer may be formed on the first magnetic layer. Portions of the second insulating layer formed on a bottom surface of the second groove, an upper surface of the second connecting magnetic layer and an upper surface of the first insulating layer may be removed by patterning the second insulating layer. The second insulating layer may be patterned using a nano-imprint process.

According to at least some example embodiments, in forming the ring-type magnetic layer, a first magnetic layer may be formed on an upper surface of the first insulating layer, an upper surface and a side surface of the second connecting magnetic layer and a bottom surface and a sidewall of the second groove. Portions of the first magnetic layer formed on a bottom surface of the second groove, an upper surface of the second connecting magnetic layer and an upper surface of the first insulting layer may be removed using anisotropic-etching on the first magnetic layer.

According to at least some example embodiments, the first and second connecting magnetic layers may be formed using electro plating. The first and second connecting magnetic layers may be formed of the same, substantially the same or different materials.

At least one other example embodiment provides a method of manufacturing an information storage device. According to at least this example embodiment, a writing magnetic layer and a first insulating layer may be formed on the substrate. The first insulating layer may cover the writing magnetic layer. A first groove may be formed to expose the writing magnetic layer by patterning the first insulating layer. A first connecting magnetic layer may be formed in the first groove. A second insulating layer may be formed on the first connecting magnetic layer and the first insulating layer. A second groove may be formed by patterning the second insulating layer to expose both of the first connecting magnetic layer and at least a portion of the first insulating layer. A second connecting magnetic layer may be formed on the first connecting magnetic layer in the second groove. A ring-type magnetic layer may be formed to cover a side surface of the second connecting magnetic layer and a sidewall of the second groove. An end portion of the ring-type magnetic layer may be removed.

At least one other example embodiment provides a method of manufacturing an information storage device. According to at least this method, a writing magnetic layer and a first insulating layer may be formed on a substrate. The first insulating layer may cover the writing magnetic layer. An opening may be formed in the first insulating layer. The opening may expose the writing magnetic layer and include at least a first groove. The first grove may be formed in a second groove, and the first groove may have a width less than a width of the second groove. A first connecting magnetic layer may be formed in the first groove, and a second connecting magnetic layer may be formed on the first connecting magnetic layer. A ring-type magnetic layer covering a side surface of the second connecting magnetic layer and a sidewall of the second groove may be formed, and an end portion of the ring-type magnetic layer may be removed.

BRIEF DESCRIPTION OF THE DRAWINGS

Example embodiments will become more apparent by describing in detail the example embodiments shown in the attached drawings in which:

FIG. 1 is a perspective view illustrating an information storage device according to an example embodiment;

FIG. 2A through 2E are perspective views illustrating an example writing operation according to an example embodiment;

DETAILED DESCRIPTION OF EXAMPLE EMBODIMENTS

Figure 2A:
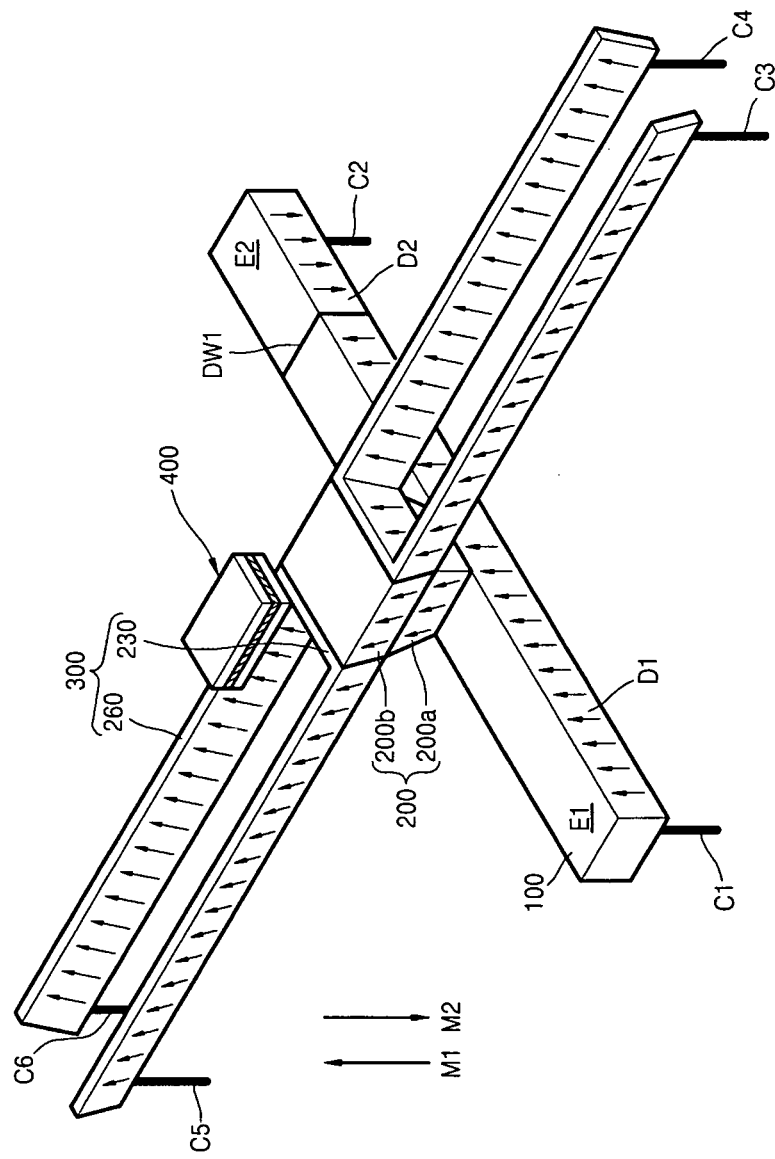

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view illustrating an information storage device (hereinafter, referred to as "information storage device") according to an example embodiment.

Referring to FIG. 1, a writing magnetic layer 100 having magnetic domain wall movement properties may be formed on a substrate (not shown). A connecting magnetic layer 200 may be formed on a first (e.g., given or desired) region of the writing magnetic layer 100. The connecting magnetic layer 200 may have a stack structure in which first and second connecting magnetic layers 200a and 200b are stacked (e.g., sequentially). Side surfaces of the first and second connecting magnetic layers 200a and 200b may be inclined or perpendicular relative to the substrate. An information storing magnetic layer 300 may be formed on an upper portion of the side surfaces of the connecting magnetic layer 200.

For example, information storing magnetic layer 300 may be formed on two opposite side surfaces of the second connecting magnetic layer 200b. Alternatively, the information storing magnetic layer 300 may be formed on different surfaces of the second connecting magnetic layer 200b. According to the surfaces on which the information storing magnetic layer 300 is formed, the writing magnetic layer 100 and the information storing magnetic layer 300 may be perpendicular or parallel to each other. The information storing magnetic layer 300 may include a first region 230 covering the side surface of the second connecting magnetic layer 200b and a second region 260 formed on both edges of the first region 230. The second region 260 may be formed perpendicular to the first region 230. According to at least some example embodiments, a single second connecting magnetic layer 200b may connect four second regions 260.

The height "H" and thickness "T" of the information storing magnetic layer 300 may be in the range of about 1 to about 100 nm, inclusive. The height "H" may be greater than the thickness "T". For example, the height "H" may be about 50 nm and the thickness "T" may be about 10 nm. An interval between the second regions 260, which are on different planes, may be more than about 10 nm, for example, in the range of about 10 to about 100 nm, inclusive. The second region 260 may be inclined with respect to the substrate by a given angle. According to at least one example embodiment, the second regions 260 may be perpendicular to the substrate.

The magnetic anisotropic energy of the writing magnetic layer 100 and the information storing magnetic layer 300 may be in the range of about $2\times10^3$ to about $10^7$ J/m$^3$, inclusive. The magnetic anisotropic energy of the first connecting magnetic layer 200a may be in the range of about 10 to about $10^3$ J/m$^3$, inclusive. The magnetic anisotropic energy of the second connecting magnetic layer 200b may be in the range of about 10 to about $10^7$ J/m$^3$, inclusive. For example, the writing magnetic layer 100 and the information storing magnetic layer 300 may be a ferromagnetic layer, and the first connecting magnetic layer 200a may be a soft magnetic layer. The second connecting magnetic layer 200b may be a ferromagnetic layer or a soft magnetic layer.

The writing magnetic layer 100 and the information storing magnetic layer 300 may be formed of a material selected from the group including or consisting of CoPt, FePt, an alloy thereof or the like, and the first connecting magnetic layer 200a may be formed of a material selected from the group including or consisting of Ni, Co, NiCo, NiFe, CoFe, CoZrNb, CoZrCr an alloy thereof or the like. The second connecting magnetic layer 200b may be formed of a material selected from the group including or consisting of Ni, Co, NiCo, NiFe, CoFe, CoZrNb, CoZrCr an alloy thereof or the like, or alternatively, a material selected from the group including or consisting of CoPt, FePt, an alloy thereof or the like.

A reader 400 for reading information stored in the information storing magnetic layer 300 may be formed on a given or desired region of the information storing magnetic layer 300. The reader 400 may be a magnetic resistance sensor such as a tunnel magneto resistance (TMR) sensor, a giant magneto resistance (GMR) sensor or the like, which are well-known. The reader 400 may be formed on a bottom surface, an upper surface or a side surface of the information storing magnetic layer 300. Alternatively, the magnetic resistance sensor 400 may be formed on an upper surface or a bottom surface of the writing magnetic layer 100.

First and second wires C1 and C2 may be formed on either of ends E1 and E2 of the writing magnetic layer 100. The first and second wires C1 and C2 may be used to supply a current. Third through sixth wires C3 to C6 may be formed on ends of the second regions 260. Third through sixth wires C3 to C6 may also be used to supply a current. Each of the first through sixth wires C1 to C6 may be connected to a driving device (not shown) such as a transistor. When a current having a given direction is supplied to the writing magnetic layer 100 through the first and second wires C1 and C2, magnetic domain walls in the writing magnetic layer 100 may be moved in a given direction. Because magnetic domain walls are moved in a direction of electrons, the direction of magnetic domain wall movement may be opposite to that of the current. A current for moving magnetic domain walls may be supplied between one of the first and second wires C1 and C2 and one of the third through sixth wires C3 to C6, or a current for moving magnetic domain walls may be supplied to a plurality (e.g., any two) of the third through sixth wires C3 to C6.

By appropriately moving magnetic domain walls in the writing magnetic layer 100, the connecting magnetic layer 200 and the information storing magnetic layer 300, data may be recorded in the information storing magnetic layer 300. Hereinafter, an example writing operation of the information storage device according to an example embodiment will be described in detail referring to FIGS. 2A through 2E. Like reference numerals in FIGS. 2A through 2E and FIG. 1 denote like elements.

Referring to FIG. 2A, the writing magnetic layer 100 may include a plurality of (e.g., two) magnetic domains D1 and D2 and one magnetic domain wall (hereinafter, referred to as "first magnetic domain wall DW1") positioned there between. The first and second magnetic domains D1 and D2 may be formed in the writing magnetic layer 100 in various ways. For example, a soft magnetic layer may be formed on one end of a ferromagnetic layer, which is to be used as the writing magnetic layer 100, and an external magnetic field may be supplied to the ferromagnetic layer and the soft magnetic layer. Accordingly, the ferromagnetic layer contacting the soft magnetic layer may have a magnetization direction different from that of other parts of the writing magnetic layer 100. According to the number and the location of the soft magnetic layer, the number of magnetic domains formed in the writing magnetic layer 100 may be different.

In FIG. 2A, the first magnetic domain wall DW1 may be positioned closer to the end E2 of the writing magnetic layer 100. The first magnetic domain D1, the connecting magnetic layer 200 and the information storing magnetic layer 300 may be magnetized in a first direction M1. The second magnetic domain D2 may be magnetized in a second direction M2.

Figure 2B:
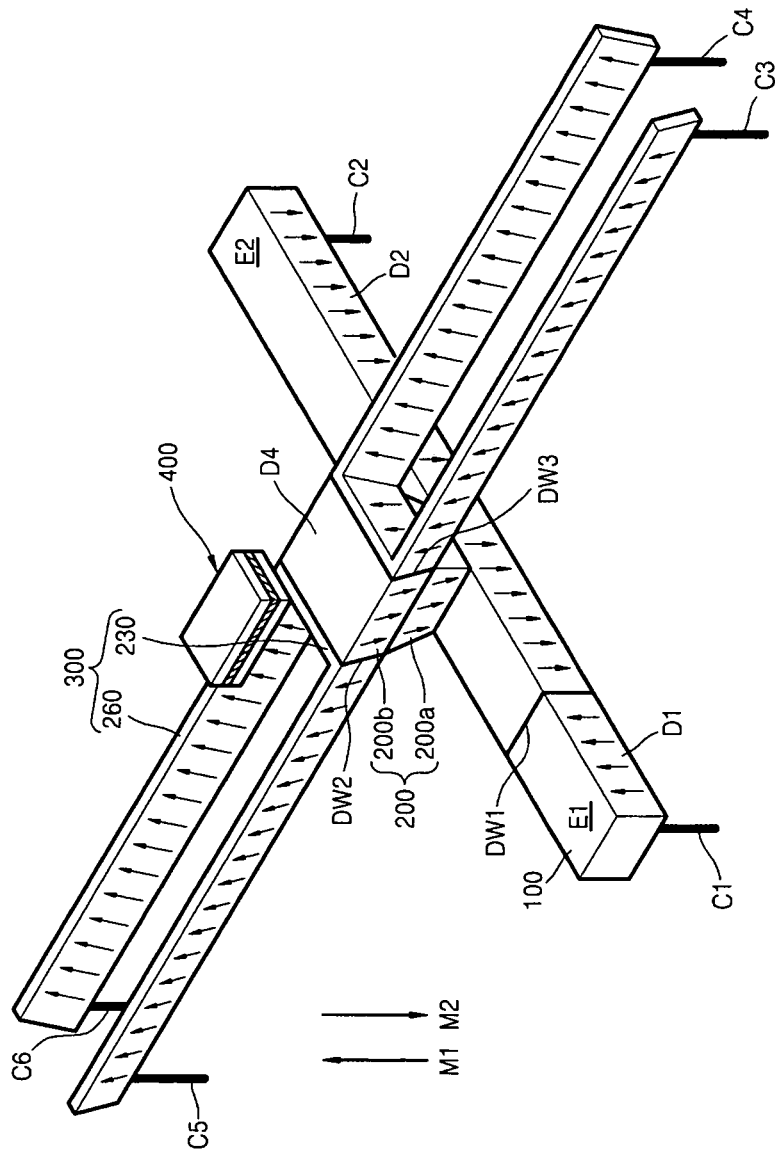

FIG. 2B is a perspective view illustrating a case in which the first magnetic domain wall DW1 of the information storage device of FIG. 2A is moved. The first magnetic domain wall DW1 may be moved by supplying a current from the first wire C1 to the second wire C2.

Referring to FIG. 2B, by moving the first magnetic domain wall DW1, the second magnetic domain D2 may extend to be below the first connecting magnetic layer 200a. As a result, a magnetization direction of the first connecting magnetic layer 200a may change (e.g., be reversed) to a second direction M2. This is because the first connecting magnetic layer 200a is a soft magnetic layer in which magnetization reversal may be performed more easily. When the magnetization direction of the first connecting magnetic layer 200a is reversed, the magnetization direction of the second connecting magnetic layer 200b may be reversed. This is because if the second connecting magnetic layer 200b and the first connecting magnetic layer 200a have the same or substantially the same magnetization direction, energy may be more stable than when the directions are opposite.

When the magnetic anisotropic energy of the second connecting magnetic layer 200b is less than that of the writing magnetic layer 100, magnetization reversal on the second connecting magnetic layer 200b may be more easily performed. Such magnetization reversal may occur serially. If a plurality of connecting magnetic layers are stacked perpendicularly, magnetization reversal may occur serially from a bottom layer of the connecting magnetic layer 200 to a top layer of the connecting magnetic layer 200.

According to such magnetization reversal, second and third magnetic domain walls DW2 and DW3 may be formed between the information storing magnetic layer 300 and the second connecting magnetic layer 200b.

Referring to FIG. 2C, a current may be supplied from a fifth wire C5 to a second wire C2 to move the second magnetic domain wall DW2 in the second region 260 connected to the fifth wire C5 by one magnetic domain unit. Thus, a third magnetic domain D3 may be formed in the second region 260 connected to the fifth wire C5. Data corresponding to the third magnetic domain D3 may be '0'.

Referring to FIG. 2D, a current may be supplied from the second wire C2 to the first wire C1, and as such the first magnetic domain wall DW1 may move from the end E1 towards the end E2. Thus, the first magnetic domain D1 may extend to be below the first connecting magnetic layer 200a. As a result, the magnetization directions of the first and second connecting magnetic layers 200a and 200b may be reversed to the first direction M1. Accordingly, a fourth magnetic domain wall DW4 may be formed on a boundary between the second region 260 connected to the fifth wire C5 and the second connecting magnetic layer 200b.

Figure 2E:
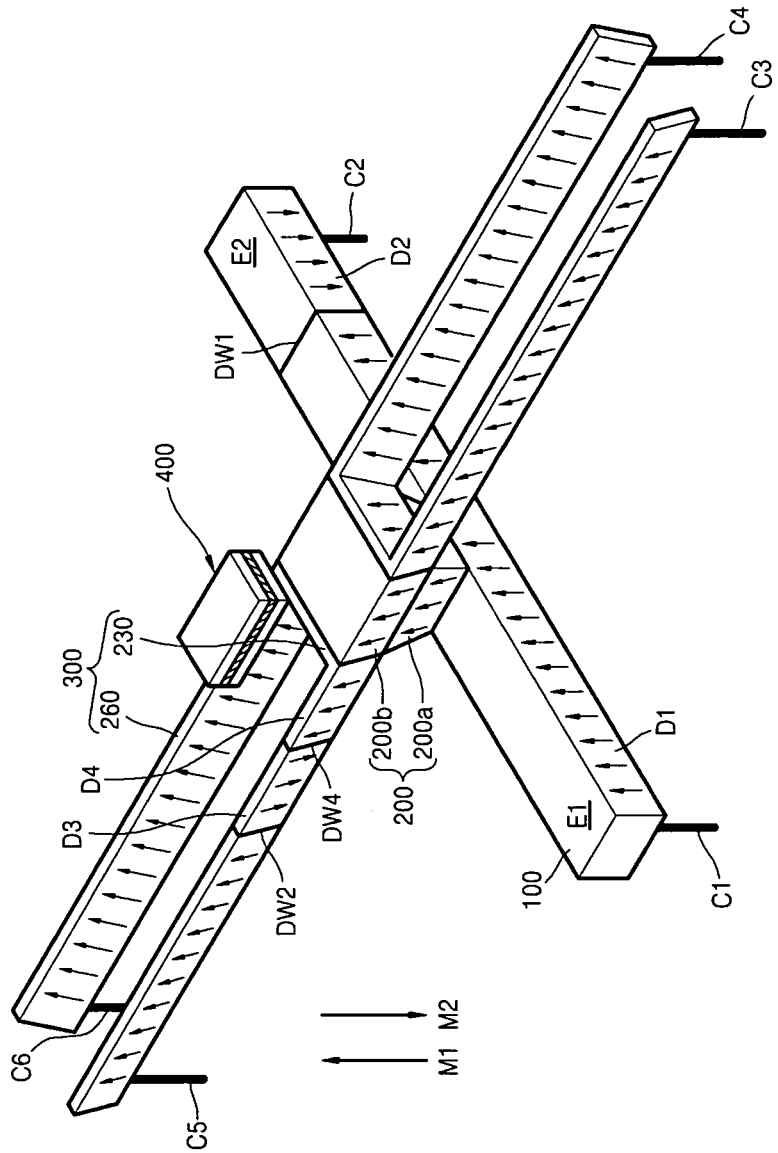

Referring to FIG. 2E, a current may be supplied from the fifth wire C5 to the first wire C1, to move a fourth magnetic domain wall DW4 in the second region 260 connected to the fifth wire C5 by one magnetic domain unit. Thus, a fourth magnetic domain D4 may be formed in the second region 260 connected to the fifth wire C5. Data corresponding to the fourth magnetic domain D4 may be '1'. The third magnetic domain D3 may also move by one magnetic domain unit. Accordingly, data corresponding to '0' and '1' may be stored in the second region 260. Using example embodiments, binary data may be stored in a given region of the information storing magnetic layer 300.

Although the writing magnetic layer 100, the connecting magnetic layer 200 and the information storing magnetic layer 300 are shown as having a perpendicular magnetic anisotropy in FIGS. 2A through 2E, the writing magnetic layer 100, the connecting magnetic layer 200 and the information storing magnetic layer 300 may have a horizontal or substantially horizontal magnetic anisotropy.

In information storage devices according to at least some example embodiments, data may be recorded by moving magnetic domain walls in the writing magnetic layer 100, the connecting magnetic layer 200 and the information storing magnetic layer 300. Accordingly, moving mechanical parts, such as those used in conventional HDDs, may not be required.

Although not illustrated, a magnetic domain may be moved to a lower portion of the reader 400 and a given read current may be supplied to the reader 400 to read the data stored in the magnetic domain. During reading and/or writing operations according to at least some example embodiments, a portion of the information storing magnetic layer 300 and/or the writing magnetic layer 100 may be used as a buffer area for temporarily storing data.

Referring back to FIG. 1, an information storage device may include a plurality of writing magnetic layers 100, a plurality of connecting magnetic layers 200 and a plurality of information storing magnetic layers 300. For example, the connecting magnetic layers 200 may be stacked in a direction perpendicular to the substrate, and the information storing magnetic layers 300 may be formed on at least two side surfaces of each of the connecting magnetic layers 200. The writing magnetic layers 100 may be spaced apart on the substrate, and the connecting magnetic layers 200 may be formed along a length direction of each of the writing magnetic layers 100. The information storing magnetic layers 300 may be formed on at least two side surfaces of each of the connecting magnetic layers 200. For example, if one connecting magnetic layer 200 and two information storing magnetic layers 300 connected to the connecting magnetic layers 200 is regarded as one column structure, a plurality of the column structures may be stacked on top of each other.

Figure 3:
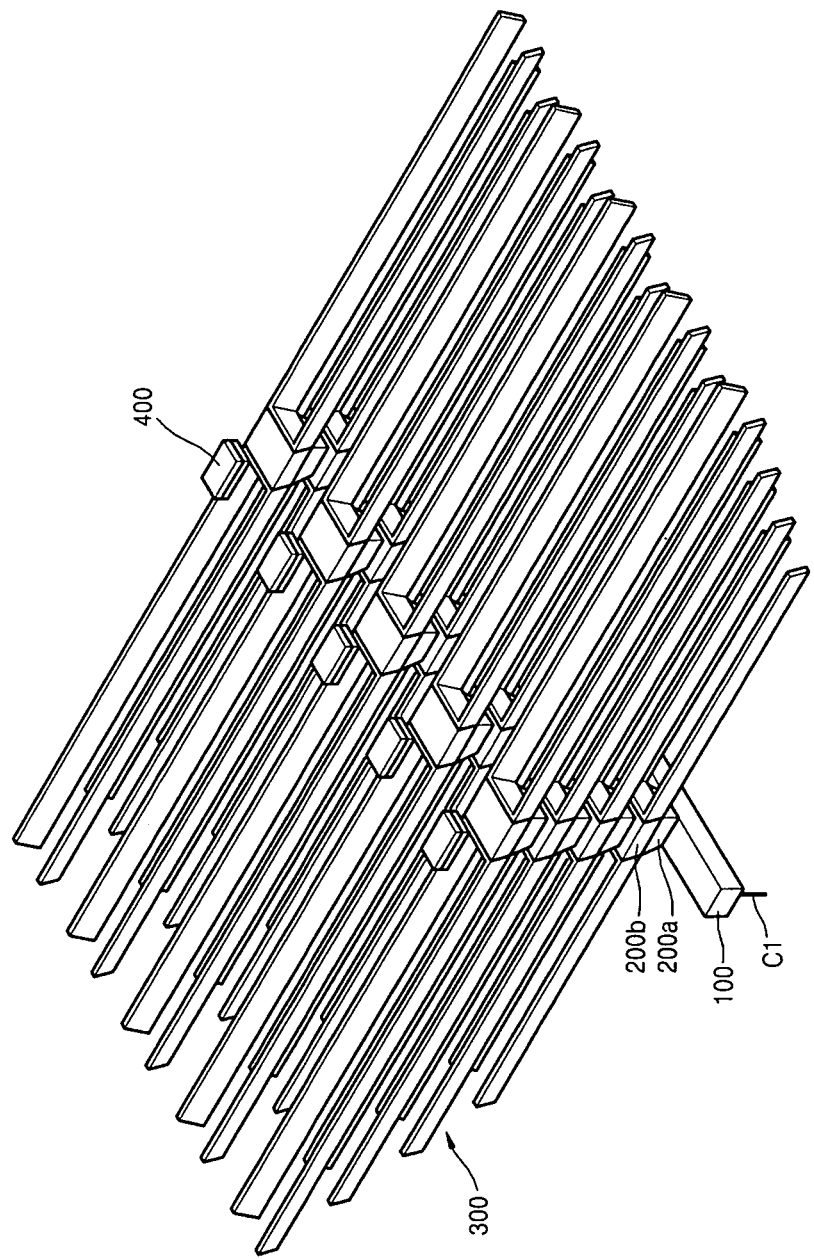
FIG. 3 is a perspective view illustrating an information storage device according to another example embodiment.

FIG. 3 is a perspective view illustrating an information storage device having a multi-stack structure according to an example embodiment.

Referring to FIG. 3, when information storing magnetic layers 300 have the multi-stack structure, a second region 260 of each of the information storing magnetic layer 300 may be longer for column structures formed higher up in the multi-stack structure so that wires (now shown) may be more easily fabricated for connecting the second region 260 and driving devices (not shown). For example, second regions 260 of each of the information storing magnetic layers 300 in each of the plurality of stack structures may have a different length. The structures illustrated in FIG. 3 may be repeatedly formed to be parallel or substantially parallel to X and/or Y axes. The directions of X and Y axes are the same as those of FIG. 1.

Example embodiments of information storage devices having the multi-stack structure may store a relatively large amount of information. For example, because one of the connecting magnetic layers 200 is connected to a plurality of (e.g., four) second regions 260 in the information storage device, the information storage device may store more information than an information storage device in which the ratio of connecting magnetic layer 200 to information storage track is 1:1 or 1:2.

A method of manufacturing of an information storage device using magnetic domain wall movement according to an example embodiment (hereinafter, referred to as "manufacturing method") will be described.

FIGS. 4A, 5A, 6A, 7A, 8A, 9A, 10A, 11A and 12A are cross-sectional views taken along a first line and illustrate a manufacturing method according to an example embodiment. FIGS. 4B, 5B, 6B, 7B, 8B, 9B, 10B, 11B and 12B are views corresponding to FIGS. 4A, 5A, 6A, 7A, 8A, 9A, 10A, 11A and 12A, respectively, which are taken along a second line and illustrate a manufacturing method according to an example embodiment. The first line corresponds to a line a-a' of FIG. 1, and the second line corresponds to lines b-b' of FIGS. 4A, 5A, 6A, 7A, 8A, 9A, 10A, 11A and 12A.

Figure 4A:
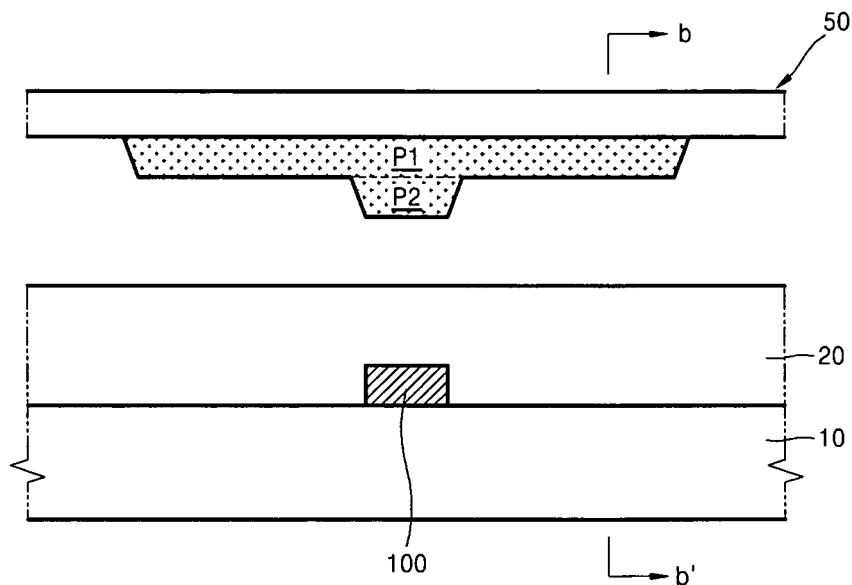
FIGS. 4A, 5A, 6A, 7A, 8A, 9A, 10A, 11A and 12A are cross-sectional views for illustrating a method of manufacturing an information storage device according to an example embodiment.
Figure 4B:
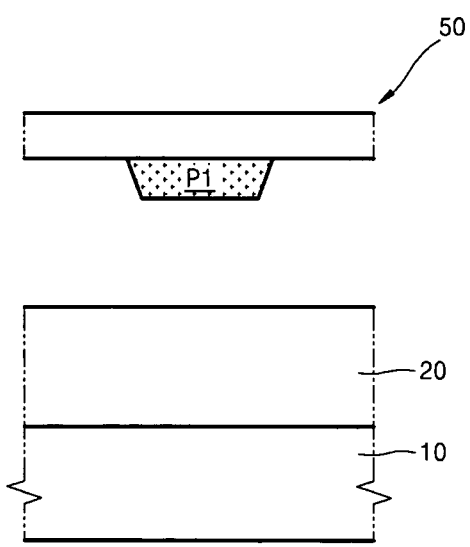
FIGS. 4B, 5B, 6B, 7B, 8B, 9B, 10B, 11B and 12B are cross-sectional views of FIGS. 4A, 5A, 6A, 7A, 8A, 9A, 10A, 11A and 12A, respectively, which are taken along a line b-b'.

Referring to FIGS. 4A and 4B, a writing magnetic layer 100 may be formed on a substrate 10. The writing magnetic layer 100 may be the same or substantially the same as a writing magnetic layer 100 of FIG. 1. A first insulating layer 20 may be formed on the substrate 10 to cover the writing magnetic layer 100. The first insulating layer 20 may be a resin layer or the like.

A first master stamp 50 may have a multi-step structure and may be positioned above the first insulating layer 20. The first master stamp 50 may be fabricated using a nano-patterning method such as E-beam lithography or the like. The first master stamp 50 may include a first protrusion P1 and a second protrusion P2 formed on central or center portion of the first protrusion P1. Sidewalls of the first and second protrusions P1 and P2 may be inclined due to slope etching. An angle (e.g., acute angle) between each of the sidewalls of the first and second protrusions P1 and P2 and the substrate 10 is referred to herein as the first angle. The first angle may depend on etching conditions during manufacturing of the first master stamp 50.

Figure 5A:
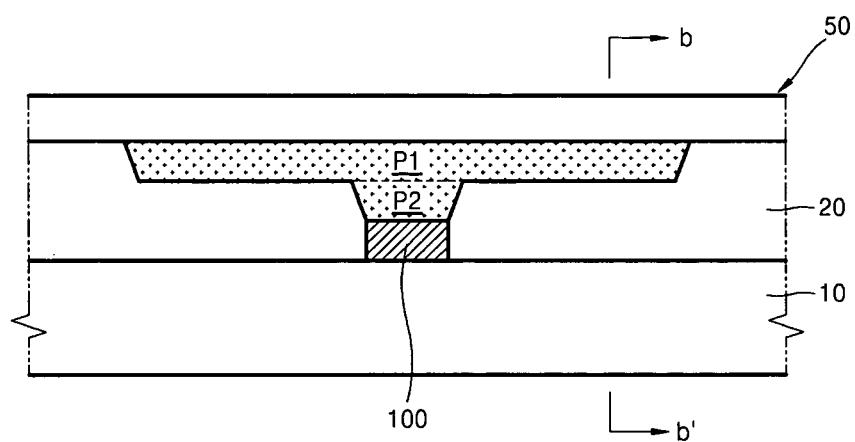
Figure 5B:
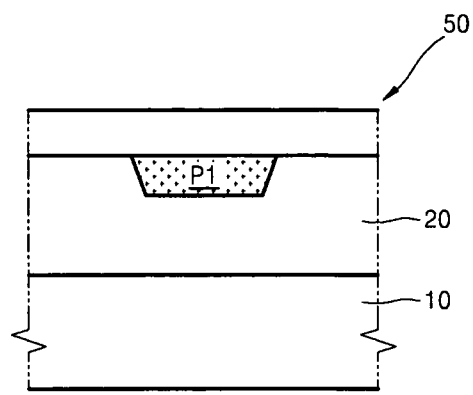

Referring to FIGS. 5A and 5B, a first insulating layer 20 may be patterned by imprinting the first insulating layer 20 using the first master stamp 50. The first master stamp 50 may be removed from the first insulating layer 20. The first master stamp 50 may be used repeatedly.

Figure 6A:
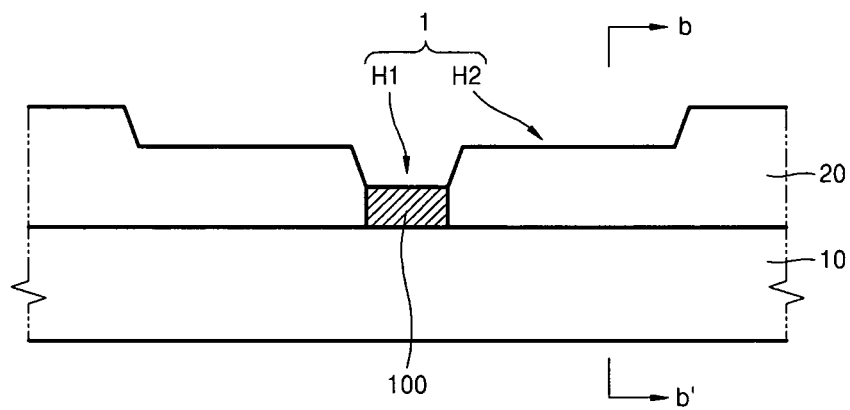
Figure 6B:
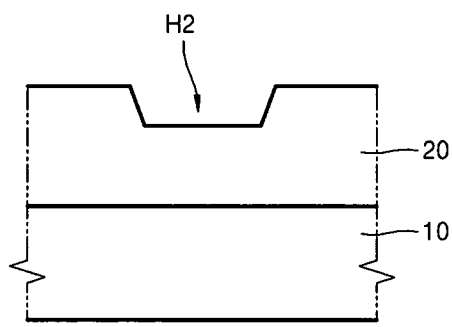

FIGS. 6A and 6B are cross-sectional views illustrating the first insulating layer 20 after the first master stamp 50 is removed. Referring to FIGS. 6A and 6B, an opening 1 may be formed using an imprint process with the first master stamp 50. The opening 1 may expose a portion of the writing magnetic layer 100. The opening 1 may include a first groove H1 and a second groove H2 formed above the first groove H1 and having a width greater than the first groove H1. Sidewalls of the first and second grooves H1 and H2 may be inclined. A part of the first insulating layer 20 may remain on a bottom of the first groove H1. Such a remaining portion of the first insulating layer 20 may be removed using reactive ion etching (RIE), plasma ashing or the like.

Figure 7A:
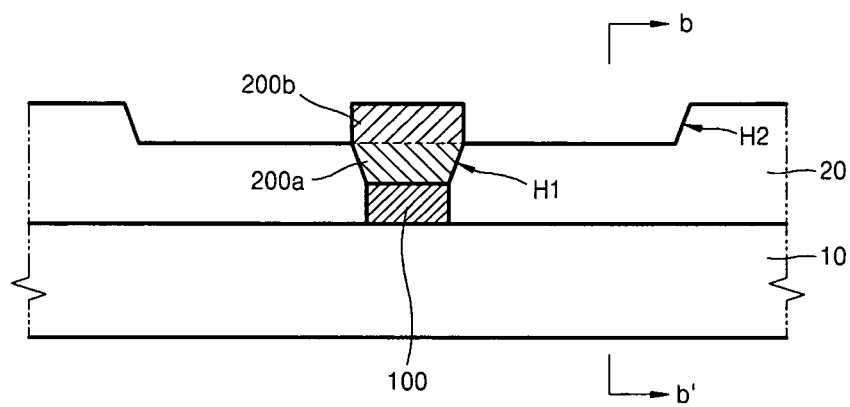
Figure 7B:
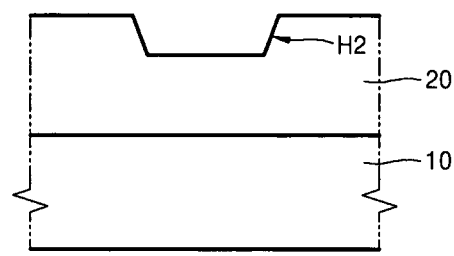

Referring to FIGS. 7A and 7B, a first connecting magnetic layer 200a may be formed in the first groove H1 using, for example, electro plating. The first connecting magnetic layer 200a may be the same or substantially the same as the first connecting magnetic layer 200a of FIG. 1. The thickness of the first connecting magnetic layer 200a may be controlled by adjusting reaction conditions and/or reaction times during the electro plating such that the height of the first connecting magnetic layer 200a and the height of the first groove H1 correspond to one another.

A second connecting magnetic layer 200b may be formed on the first connecting magnetic layer 200a using electro plating. The second connecting magnetic layer 200a may be the same or substantially the same as the second connecting magnetic layer 200b of FIG. 1, and may have a height similar or substantially similar to that of the second groove H2. The width of the second connecting magnetic layer 200b measured along the x-axis may be greater than the width of the first connecting magnetic layer 200a measured along the x-axis. The x-axis may be the same as that of FIG. 1.

Figure 8A:
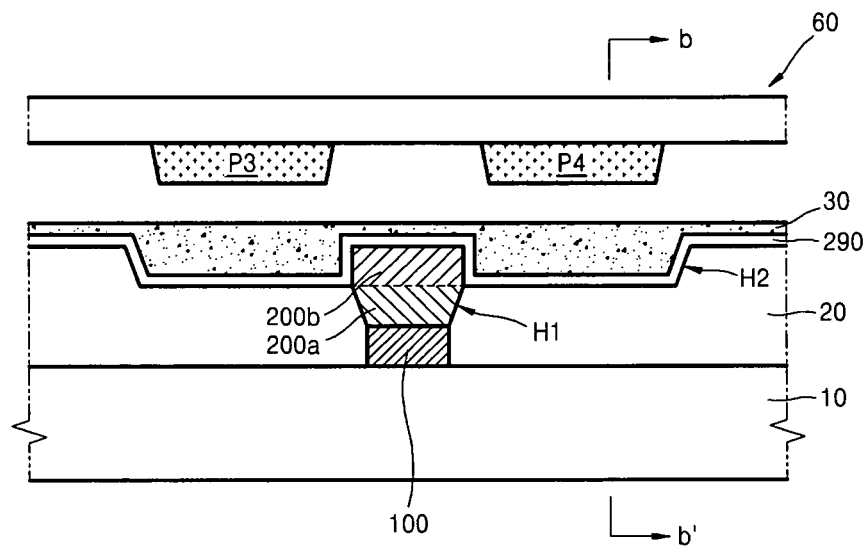
Figure 8B:
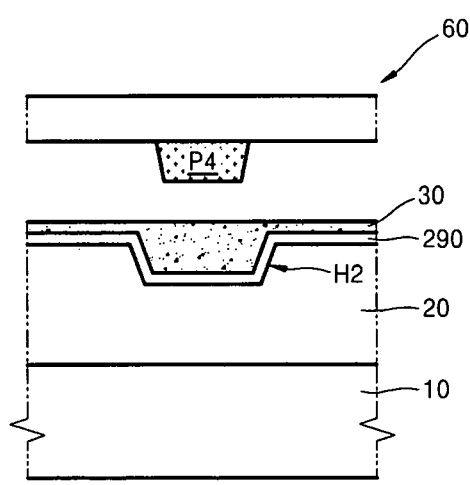

Referring to FIGS. 8A and 8B, a magnetic layer 290 may be formed on an exposed surface of the second groove H2, an upper surface of the first insulating layer 20 and an exposed surface of the second connecting magnetic layer 200b. A second insulating layer 30 may be formed on the magnetic layer 290. The second insulating layer 30 may be a resin layer or the like.

A second master stamp 60 may be positioned on the second insulating layer 30. The second master stamp 60 may be fabricated using a nano-patterning method such as E-beam lithography or the like. According to at least one example embodiment, the second master stamp 60 may be fabricated in a manner similar or substantially similar to the method of manufacturing the first master stamp 50. The second master stamp 60 may include third and fourth protrusions P3 and P4, which may be spaced apart from each other. The third and fourth protrusions P3 and P4 each may have a shape and a size appropriate to be inserted into the second groove H2 on either side of the second connecting magnetic layer 200b. The third and fourth protrusions P3 and P4 may be narrower than the second groove H2 in accordance with a process margin. Sidewalls of the third and fourth protrusions P3 and P4 may be inclined. An angle (e.g., acute angle) between each of sidewalls of the third and fourth protrusions P3 and P4 and the substrate 10 may be referred to as a second angle. The second angle may be greater than the first angle.

Figure 9A:
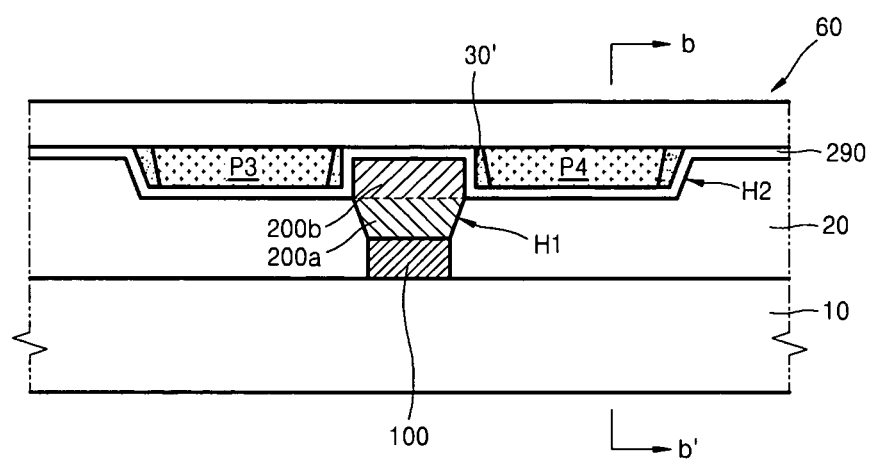
Figure 9B:
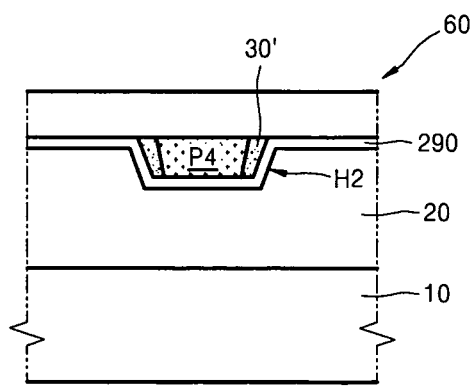

Referring to FIGS. 9A and 9B, a second insulating layer 30 may be patterned by imprinting the second insulating layer 30 using the second master stamp 60. After patterning, a portion of the second insulating layer 30 may remain to cover portions of the magnetic layer 290 formed on side surfaces of the second connecting magnetic layer 200b and sidewalls of the second groove H2. Hereinafter, such remaining parts of the second magnetic layer 30 will be referred to as a sidewall protective layer 30'.

The second master stamp 60 may be removed from the sidewall protective layer 30' and the magnetic layer 290. The second master stamp 60 may be used repeatedly.

Figure 10A:
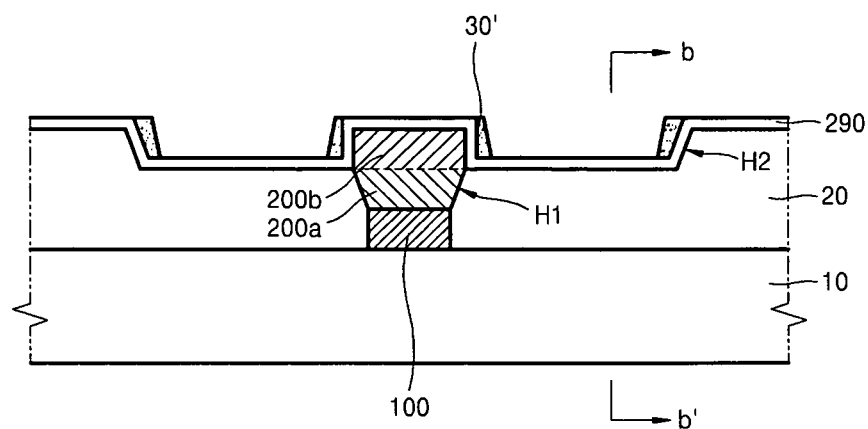
Figure 10B:
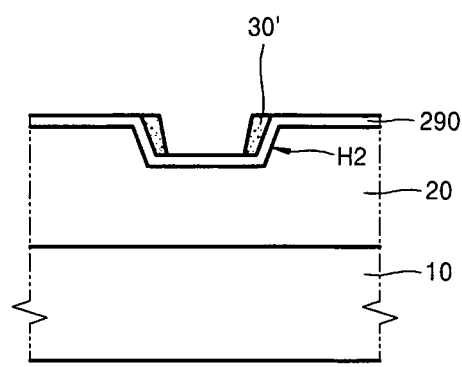

FIGS. 10A and 10B are cross-sectional views illustrating the state after the second master stamp 60 is removed. Referring to FIGS. 10A and 10B, portions of the magnetic layer 290 formed on a bottom surface of the second groove H2, an upper surface of the second connecting magnetic layer 200b and an upper surface of the first insulating layer 20 may be exposed using an imprinting process with the second master stamp 60.

Figure 11A:
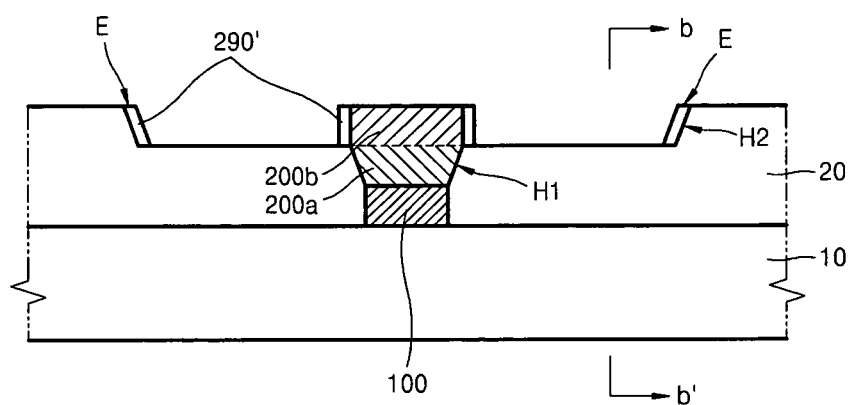
Figure 11B:
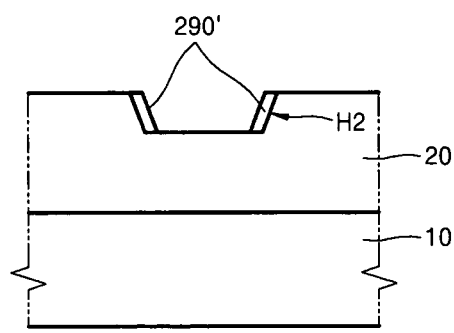

Referring to FIGS. 11A and 11B, the magnetic layer 290 may be etched using the sidewall protective layer 30' as an etching mask, and portions of the magnetic layer 290 formed on a bottom surface of the second groove H2, an upper surface of the second connecting magnetic layer 200b and an upper surface of the first insulating layer 20 may be removed. Accordingly, portions of the magnetic layer 290 corresponding to the sidewall protective layer 30' may remain to cover side surfaces of the second connecting magnetic layer 200b and side surfaces of the second groove H2. Hereinafter, such remaining portions of the magnetic layer 290 may be referred to as a ring-type magnetic layer 290'. After forming the ring-type magnetic layer 290', the sidewall protective layer 30' may be removed.

An end portion E of the ring-type magnetic layer 290' not contacting the second connecting magnetic layer 200b may be removed. The end portion E of the ring-type magnetic layer 290' may be removed using photolithography methods or the like. For example, a photosensitive layer having an opening exposing the end portion E of the ring-type magnetic layer 290' may be formed, and the end portion E of the ring-type magnetic layer 290' may be selectively removed using the photosensitive layer as an etching mask.

Figure 12A:
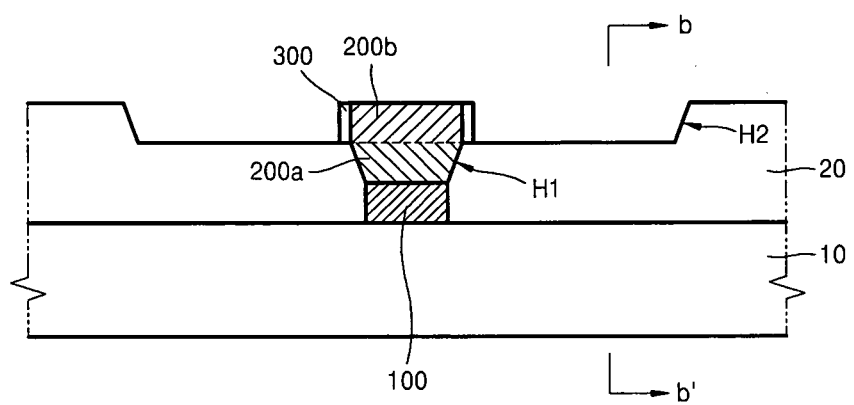
Figure 12B:
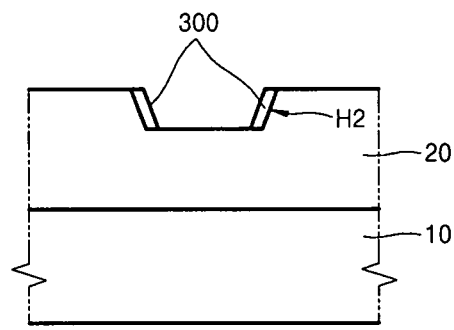

As shown in FIGS. 12A and 12B, illustrates a state after the end portion E is removed. The ring-type magnetic layer 290', of which the end portion E is cut, is referred to as an information storing magnetic layer 300. A reader (not shown) may be formed on a given region of the information storing magnetic layer 300.

Although an example embodiment of a method of manufacturing a structure of FIG. 1 has been described with regard to FIGS. 4A through 12B, such method may be used in a method of manufacturing an information storage device having a multi-stack structure as shown in FIG. 3.

According to example embodiments of manufacturing methods, a plurality of (e.g., two) grooves may be formed using one imprint process with a multi-step master stamp. Four second regions 260 connected to the one connecting magnetic layer 200 may be formed (e.g., simultaneously). According to example embodiments, information storage devices storing a relatively large amount of information may be produced by a relatively small number of processes.

Various changes to example embodiments may be made. For example, if sidewalls of the first and second protrusions P1 and P2 of the first master stamp 50 are perpendicular to the substrate 10, the ring-type magnetic layer 290' may be formed by anisotropic-etching the magnetic layer 290 rather than forming the second insulating layer 30. Because the second master stamp 60 is not used, the process may be simplified. If two master stamps having a single-step structure are used instead of the first master stamp 50 having a multi-step structure, the first insulating layer 50 may be formed using two operations, and the first groove H1 and the second groove H2 may be formed separately.

According to example embodiments, information storage devices may store relatively large amounts of information, provide improved mobility, reliability and/or may be more easily produced using a relatively small number of processes.

While example embodiments have been particularly shown and described with reference to exemplary embodiments thereof, it will be understood by those of ordinary skill in the art that various changes in position relations of the writing magnetic layer, the connecting magnetic layer and the information storing magnetic layer may be made therein without departing from the spirit and scope of the present invention as defined by the following claims.

What is claimed is:

1. A method of manufacturing an information storage device, the method comprising:
    forming a writing magnetic layer on a substrate;
    forming a first insulating layer on the substrate, the first insulating layer covering the writing magnetic layer;
    forming an opening in the first insulating layer, the opening exposing the writing magnetic layer and including at least a first groove, the first grove being formed in a second groove, and the first groove having a width less than a width of the second groove;
    forming a first connecting magnetic layer in the first groove;
    forming a second connecting magnetic layer on the first connecting magnetic layer;
    forming a ring-type magnetic layer covering a side surface of the second connecting magnetic layer and a sidewall of the second groove; and
    removing an end portion of the ring-type magnetic layer.

2. The method of claim 1, wherein the opening is formed by patterning the first insulating layer.

3. The method of claim 2, wherein the patterning is performed using a nano-imprint process with a master stamp having a multi-step structure.

4. The method of claim 1, wherein the sidewall of the second groove is inclined with respect to the substrate.

5. The method of claim 1, wherein the sidewall of the second groove is perpendicular with respect to the substrate.

6. The method of claim 1, wherein the forming of the ring-type magnetic layer includes,
    forming a first magnetic layer on an upper surface of the first insulating layer, an upper surface and a side surface of the second connecting magnetic layer, and a bottom surface and a sidewall of the second groove, and
    removing portions of the first magnetic layer formed on the bottom surface of the second groove, the upper surface of the second connecting magnetic layer and the upper surface of the first insulating layer.

7. The method of claim 6, wherein the forming the ring-type magnetic layer further includes,
    forming a protective layer covering a portion of the first magnetic layer, the portion of the first magnetic layer formed on the side surface of the second connecting magnetic layer and the sidewall of the second groove, and wherein the portions of the first magnetic layer formed on the bottom surface of the second groove, the upper surface of the second connecting magnetic layer and the upper surface of the first insulating layer are removed by etching the first magnetic layer using the protective layer as an etching mask.

8. The method of claim 7, wherein the forming of the protective layer includes, forming a second insulating layer on the first magnetic layer, and patterning the second insulating layer to remove portions of the second insulating layer formed on a bottom surface of the second groove, an upper surface of the second connecting magnetic layer and an upper surface of the first insulating layer.

9. The method of claim 8, wherein the second insulating layer is patterned using a nano-imprint process.

10. The method of claim 6, wherein the portions of the first magnetic layer formed on the bottom surface of the second groove, the upper surface of the second connecting magnetic layer and the upper surface of the first insulating layer are removed by performing anisotropic-etching on the first magnetic layer.

11. The method of claim 1, wherein the first and second connecting magnetic layers are formed using electro plating.

12. The method of claim 1, wherein the first and second connecting magnetic layers are formed of different materials.

13. The method of claim 1, wherein the first and second connecting magnetic layers are formed of the same material.

14. A method of manufacturing an information storage device, the method comprising:

forming a writing magnetic layer on a substrate;

forming a first insulating layer on the substrate, the first insulating layer covering the writing magnetic layer;

forming a first groove in the first insulating layer, the first groove exposing the writing magnetic layer;

forming a first connecting magnetic layer in the first groove;

forming a second insulating layer on the first magnetic connecting layer and the first insulating layer;

forming a second groove in the second insulating layer, the second groove exposing the first connecting magnetic layer and at least a portion of the first insulating layer;

forming a second connecting magnetic layer on the first connecting magnetic layer in the second groove;

forming a ring-type magnetic layer covering a side surface of the second connecting magnetic layer and a sidewall of the second groove; and removing an end portion of the ring-type magnetic layer.

15. The method of claim 14, wherein the first groove is formed using a nano-imprint process.

16. The method of claim 14, wherein the second groove is formed using a nano-imprint process.

* * * * *